United States Patent [19]

Fraser et al.

[11] Patent Number: 4,542,257

[45] Date of Patent: Sep. 17, 1985

[54] SOLAR CELL ARRAY PANEL AND METHOD OF MANUFACTURE

[75] Inventors: Allister F. Fraser, Thousand Oaks, Calif.; Walter G. Alsbach, McLean, Va.

[73] Assignees: Hughes Aircraft Company, El Segundo, Calif.; International Telecommunications Satellite Organization, Washington, D.C.

[21] Appl. No.: 604,548

[22] Filed: Apr. 27, 1984

[51] Int. Cl.⁴ .................... H01L 31/04; H01L 31/18
[52] U.S. Cl. .................................. 136/251; 136/244; 29/572; 29/588; 156/297; 156/299; 156/300; 156/307.7; 528/353
[58] Field of Search .............. 136/244, 251, 259; 29/572, 588; 156/297, 299, 300, 307.7; 528/353

[56] References Cited

U.S. PATENT DOCUMENTS

| 3,356,648 | 12/1967 | Rogers | 528/353 |
|---|---|---|---|
| 4,287,382 | 9/1981 | French | 136/244 |
| 4,433,201 | 2/1984 | Fellas | 136/251 |
| 4,438,273 | 3/1984 | Landis | 549/303 |

OTHER PUBLICATIONS

D. C. Carmichael et al., *Conf. Record, 12th IEEE Photovoltaic Specialists Conf.* (1976), pp. 321–322.

*Primary Examiner*—Aaron Weisstuch
*Attorney, Agent, or Firm*—Sughrue, Mion, Zinn, Macpeak and Seas

[57] ABSTRACT

An integral lightweight solar cell panel containing a plurality of interconnected solar cells bonded to a fiber-reinforced polyimide film made from an isoimide-containing precursor. The solar cells can be placed on the reinforced polyimide film while the film is in a partially cured condition and the cells become bonded to the film upon completion of the cure. A transparent polymeric film, such as a polyimide, can be used as protective means for the front surfaces of the cells.

25 Claims, No Drawings

SOLAR CELL ARRAY PANEL AND METHOD OF MANUFACTURE

BACKGROUND OF THE INVENTION

The present invention relates to a solar cell panel comprising an array of interconnected solar cells within a space defined by a support member and a transparent cover member.

Physically, a solar cell array panel comprises an insulating substrate or support member, in the prior art usually a fiber-reinforced polyimide sheet such as Kapton ® foil reinforced through bonding to a fibrous weave, a plurality of solar cells with inter-connectors bonded to the substrate and with a thin sheet of a clear, radiation-protection material such as a sheet of glass or fused silica bonded to the front of each of the solar cells.

A manufacturing process would include, inter alia, bonding the fiber reinforcement to the substrate through an adhesive, bonding the solar cells to the substrate laminate through the use of an adhesive and also bonding the quartz or glass covers by means of adhesive to the individual solar cells. The aforementioned manufacturing steps are in addition to interconnector welding, cutting of cover glasses, etc., which in combination with the aforementioned bonding steps have prevented the production of low-cost, light-weight, acceptable solar cell array panels.

Kapton ® polyimide is available only in sheet form. It is difficult to reproducibly manufacture and inspect the bond between the reinforcement fibers, such as a graphite weave, and the Kapton ® foil to provide the needed thermal and mechanical properties at minimum weight.

Recently, polyimide compositions have been developed which can be coated in liquid form onto the front surfaces of solar cells (i.e. the surfaces exposed to the external environment in the final solar cell assembly) to provide protection sufficient for use in outerspace. The limitations of other polymers, such as being colored, discoloring excessively, inadequate stability and the like are not found in the use of these new polyimide compositions, which also enable one to avoid the excessive weight of glass and quartz coverplates.

The above-referenced polyimide compositions useful to encapsulate solar cells are disclosed in co-pending application Ser. No. 451,137, filed Dec. 20, 1982, by DuPont and Bilow, expressly incorporated herein by reference. The DuPont and Bilow polyimide provides a coating which (1) is colorless, (2) is transparent to the solar radiation in the visible light spectrum, (3) is relatively non-brittle, (4) has a high degree of thermal stability, (5) readily transmits solar radiation without appreciable degradation, (6) is heat resistant, (7) does not degrade significantly when exposed to ultraviolet radiation, and (8) is highly effective in protecting against electrons and low energy proton radiation.

The above-described DuPont and Bilow polyimide coatings are formed from a polyimide composition which has the recurring structural unit shown below:

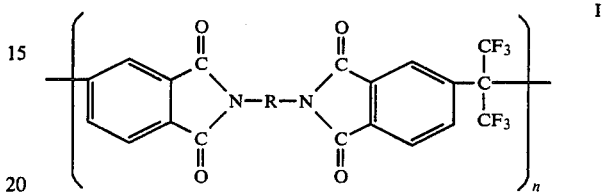

where R is:

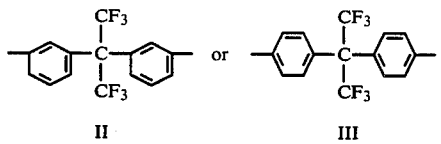

and n has a value range from 10 to about 2000. Preferably, n has a value from about 20 to about 1000.

The polyimide which is most preferred according to the DuPont and Bilow invention is the meta amino phenylene derivative of formula II above, and having the recurring structural unit:

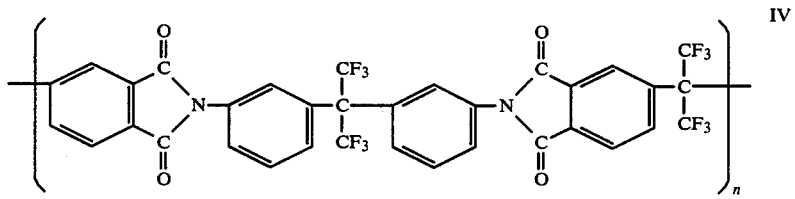

and its precursor has the polyamic acid structure:

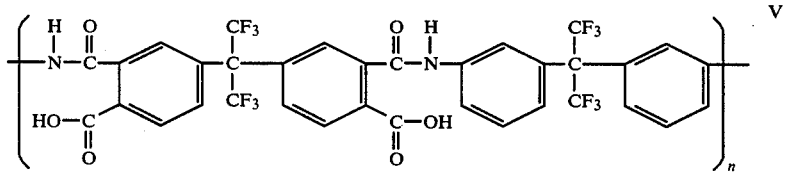

where n has the values noted above.

The polyimide of formula IV above is prepared by the reaction of substantially equal molar proportions of the two monomers 2,2-bis(3-aminophenyl)hexafluoropropane and 4,4'-hexafluoroisopropylidene[bis(phthalic anhydride)], in a solvent for such monomers. The solvents which can be used include, for example, tetrahydrofuran, N-methyl pyrrolidinone, N-methylformamide, dimethylformamide and N,N-dimethylacetamide and mixtures thereof. The resulting polyamic acid solution can be cast as a film and the film imidized to the polyimide structure IV above. Both the polyamic acid and the polyimide have an inherent viscosity of at least 0.1, usually 0.3–0.5. The inherent viscosity of the polyimide is measured at 30° C. as a 0.5% solution in a suitable solvent, such as cold concentrated (95%) sulfuric acid or methanesulfonic acid.

As noted above, in preparing the coated solar cells, a solution of the polyamic acid precursor of formula V above in a solvent, such as tetrahydrofuran, at a concentration of about 10 to about 30% of the polyamic acid, can be used as a varnish for application to the active surface of a solar cell.

The varnish or solution of the polyamic acid precursor can be coated over, where desired, a primer coating such as a silane adhesion promoter, or the solar cell in any suitable manner, for example, by dipping, electrocoating, spraying, electrostatic spraying and the like. A 15% solid content solution of the polymer in N-methylpyrrolidinone or dimethylformamide has been found to be effective. The solution is sprayed after applying the primer (Union Carbide A1100, aminopropyltrimethoxysilane) from a 5% solution in ethanol. The amount of the polyamic acid in the solvent will vary depending primarily on the type of sprayer or other coating means which is used. The solid content of the polyamic acid in the solvent solution can vary greatly and could be as high as 30% in tetrahydrofuran and in which solution dimethylformamide can be present in an amount of normally at least 60%.

After application of the polyamic acid varnish to the solar cell, that is, over the primer, the solvent is essentially evaporated off and the amic acid polymer is converted into the imidized or polyimide structure of formula IV by heating such amic acid polymer at about 250° C. Lower temperatures, such as at 120° C., can also be used to promote the imidization, but the reaction rate is slower and the elimination of solvent residues is slower. Preferred imidization temperatures range between about 160° C. and 250° C. Thinner coatings (about 0.1 mil thick) can be dried and then cured for 1 to 2 hr. at 485° F. (about 250° C.) in vacuum. However, the preferred temperature for effecting imidization is that which provides the best solar cell performance, and this may vary depending upon the specific type of cell and the specific batch of amic acid polymer available.

The polyimide film thus formed is generally a very thin layer, as is the silane primer film. The polyimide film itself is preferably about 0.2 to 0.5 mil thick. However, the practical minimum thickness is about 0.1 mil. There is no absolute maximum thickness, except that the film should be as thin as possible and yet provide the desired characteristics to protect the solar cell from radiation.

Although the employment of the above-described polyimide coatings has provided lighter weight solar cell array panels, the deficiencies existent in the Kapton ®-type substrate and the need for at least two adhesive bonding steps in the manufacturing process remain.

SUMMARY OF THE INVENTION

Therefore, it is an object of the present invention to provide a solar cell array panel characterized by an improved substrate, not requiring the use of a fiber-reinforced laminate of polyimide foil.

Another object of the present invention is to provide an improved solar cell array panel comprising a transparent polyimide protective coating and a novel substrate for the solar cell, said novel substrate not requiring the use of a fiber-reinforced laminate of polyimide foil.

Still another object of the present invention is to provide an improved manufacturing process for producing a solar cell array panel which does not necessitate adhesively bonding polyimide film to a fiber-reinforcement and does not necessitate adhesively bonding a plurality of solar cells to a substrate or support member.

In accordance with the present invention, a fiber-reinforced polyimide film as described in detail hereinafter, is utilized as the substrate or support member. The ease of processing this isoimide precursor, relative to conventional polyimide precursors, allows the fiber reinforcement to be incorporated before the film is cured (prepreg), so that post-cure lamination to a fiber reinforcement is not required.

In the manufacturing embodiment of the present invention, the isoimide group-containing oligomer is at least partially cured with reinforcement fibers dispersed therein, and solar cells can be positioned on the reinforced polyimide film prior to completion of the cure, i.e., in a partially cured, state. As the isoimide groups cure converting to polyimide, the fiber reinforcement and solar cells are bonded in place within and to the surface of the film. In another manufacturing embodiment of the invention, a plurality of solar cells with interconnectors are arranged in an interconnected array, then the protective transparent polyimide is coated onto the front surfaces of the solar cells, utilizing techniques such as masking the interconnectors, and then the array is positioned on or partially within the partially cured fiber-reinforced polyimide containing isoimide groups.

DETAILED DESCRIPTION OF THE INVENTION

The transparent polyimide protective coating has been described hereinabove.

The polyimide containing isoimide groups used as the matrix for the support member of the solar panel disclosed herein, are disclosed in allowed co-pending application Ser. No. 286,317, filed July 24, 1981, now U.S. Pat. No. 4,438,273, and continuation-in-part application Ser. Nos. 535,460; 535,975; 536,068, all filed Sept. 26, 1983, by Landis, now U.S. Pat. Nos. 4,495,342; 4,485,231; and 4,496,711, respectively, all expressly incorporated herein by reference. These polymers are formed by curing oligomers containing isoimide groups in sufficient quantity to increase oligomer-solubility in common solvents such as aliphatic ether solvents, dialkylketones, tetrahydrofuran, amides such as dimethylformamide, glycolic ethers, alcohols, cycloaliphatic ethers and other common lacquer solvents such as N,N-dimethylacetamide or N-methylpyrrolidinone, and to slow the curing rate so that the oligomer(s) can be slowly cured in a controlled manner, as compared with the corresponding oligomer which contains all imide groups in place of isoimide groups. Of particular importance with regard to space applications is the fact that these polymers are formed by an addition reaction, rather than a condensation reaction as in the prior art, and, thus, the problem of out-gassing has been obviated. Such out-gassing is known to cause separation of the substrate and the adhesive layer.

In general, the isoimide-containing oligomers can be used in the practice of the present invention as long as at least 30% of the positions in the oligomer which could be either isoimide or imide groups [i.e. (iso)imide groups] are isoimide groups. Thus, the oligomer will contain at least one isoimide group having the structure

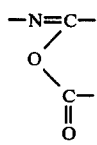

along with at least two terminal groups capable of undergoing addition polymerization, either alone or in combination with a compatible comonomer.

The isoimide oligomers can be selected from the group having the formulae, where for convenience all groups which could be either imide or isoimide groups are depicted as isoimide groups:

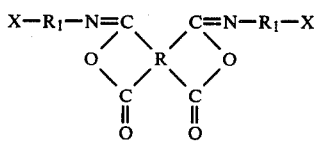 (A)

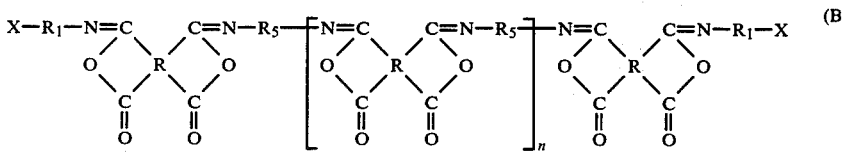 (B)

and

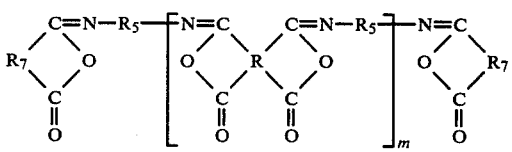 (C)

where R is a tetravalent organic group containing 2 to 27 carbon atoms, $R_1$ is a divalent organic group containing 1 to 20 carbon atoms, $R_5$ is a divalent aromatic group containing from 6 to 30 carbon atoms, $R_7$ is a trivalent aryl group having substituted thereon X, or a heterocyclic group, or a radical containing an alkenylene group, X is an unsaturated functional group capable of undergoing addition polymerization, n denotes the degrees of polymerization and is 0 or 1 to about 30, preferably 0 or 1 to about 15, and m denotes the degree of polymerization and is 1 to about 30 and preferably 1 to about 15.

Of the above, the oligomers of the formula (B) are believed to be best suited for use in the substrate of the solar cell array panel of this invention.

More generally, to form one type of oligomer used herein, a carboxylic acid dianhydride having the formula:

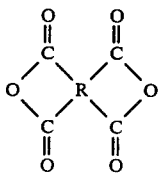

wherein R is a tetravalent organic group containing 2 to 27 carbon atoms, is reacted with a functional monoamine having the formula $H_2N-R_1-X$ wherein $R_1$ is a divalent organic group containing 1 to 20 carbon atoms and X is a functional group capable of undergoing addition polymerization, alone or with a co-monomer, to form the corresponding polyamic acid. The resulting polyamic acid is then dehydrated, preferably with a dehydrating agent under conditions to form a corresponding isoimide and/or isoimide-imide containing oligomer.

The resulting oligomer can be one of two position isomers, either the cis isomer

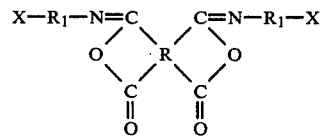

or the corresponding trans isomer:

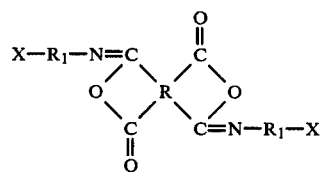

In actual practice, the oligomer is frequently a mixture of the above two isomers along with smaller amounts of oligomers containing an isoimide group and an imide group having the structure:

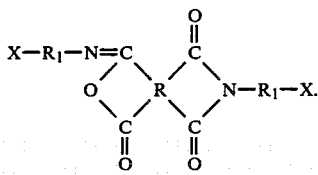

In addition, the reaction product may also contain small amounts of the corresponding di-imide.

The carboxylic acid dianhydride is one in which the R group is preferably an aryl group containing 6 to 18 carbon atoms, or a heterocyclic containing 5 to 18 carbon atoms. Representative of such groups are the following:

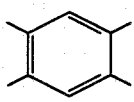

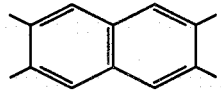

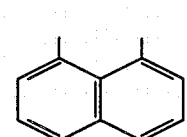

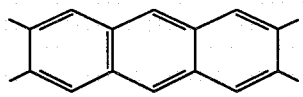

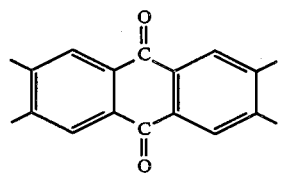

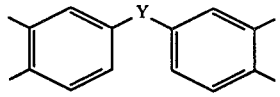

where Y is

—(CH$_2$)$_x$— where x is an integer from 1 to 5, —O—, —S—, —SO$_2$—, —(CF$_2$)$_x$—, —C(CF$_3$)$_2$—, —C(CH$_3$)$_2$— where x is as defined above, as well as the following groups:

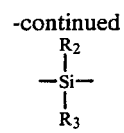

wherein R$_2$ and R$_3$ are aryl (such as phenyl or naphthyl and substituted derivatives thereof) or alkyl containing 1 to 5 carbon atoms.

Such anhydrides are known to those skilled in the art and are described in U.S. Pat. Nos. 3,261,811 and 3,345,342, the disclosures of which are incorporated herein by reference. Typical of such anhydrides are:
pyromellitic anhydride
3,4,3′,4′-benzophenone tetracarboxylic dianhydride
2,3,6,7-naphthalene tetracarboxylic dianhydride
3,3′,4,4′-diphenyl tetracarboxylic dianhydride
1,2,5,6-naphthalene tetracarboxylic dianhydride
2,2′,3,3′-diphenyl tetracarboxylic dianhydride
2,2-bis(3,4-dicarboxyphenyl)propane dianhydride
bis(3,4-dicarboxyphenyl)sulfone dianhydride
3,4,9,10-perylene tetracarboxylic dianhydride
bis(3,4-dicarboxyphenyl)ether dianhydride
2,6-dichloronaphthalene-1,4,5,8-tetracarboxylic dianhydride
phenanthrene-1,8,9,10-tetracarboxylic dianhydride
1,1-bis(2,3-dicarboxyphenyl)ethane dianhydride
2,2-bis(3,4-dicarboxyphenyl)hexafluoroisopropylidene dianhydride
2,2-bis[4-(3,4-dicarboxyphenoxy)phenyl]hexafluoropropane dianhydride Other dianhydrides may also be used, including those containing heterocyclic rings, such as S-heterocycles, O-heterocycles, N-heterocycles and combinations thereof. For example, use can also be made of pyrazine-2,3,5,6-tetracarboxylic dianhydride or thiophene-2,3,4,5-tetracarboxylic dianhydride.

As the mono-amine reacted with the dianhydride, use should be made of a mono-amine which is substituted with a functional group capable of undergoing addition polymerization reactions. Such functional groups are well known to those skilled in the art. In general, the functional group is one containing carbon-to-carbon unsaturation, usually ethylenic unsaturation or acetylenic unsaturation; it is also possible to employ, as the functional group, a cyano group which can be co-polymerized by reaction with, for example, terephthalonitrile-N,N′dioxides as described in U.S. Pat. No. 3,864,309, the disclosure of which is incorporated herein by reference.

The mono-amine can have the formula H$_2$N—R$_x$—X wherein R$_1$ is a divalent organic group containing 1 to 20 carbon atoms and X is the functional group. X is preferably selected from the group consisting of C≡CH, CH=CH$_2$, CN or the following group:

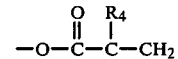

where R$_4$ is H or CH$_3$. Representative of suitable amines are allyl amine, propargyl amine, 3-aminophenyl acetylene, 3-(3-aminophenoxy)phenyl acetylene, 3-aminostyrene, 3-amino-4-bromostyrene, 3-aminobenzonitrile, 4-aminophenyl acrylate, 3-aminobenzyl methacrylate, 4-aminobenzylmethacrylate, etc.

In carrying out the reaction between the dianhydride and the mono-amine as described above, at least one mole of the mono-amine per mole of the dianhydride is employed. Preferably, the mono-amine is reacted with the dianhydride in a molar ratio ranging from about 1.2 to about 2.5 moles of monoamine per mole of dianhydride, although it will be understood that greater amounts of the mono-amine may be used. The reaction can be carried out in the presence of a solvent, such as an aliphatic ether solvent, although other inert or reactive solvents may be used.

The temperature at which the reaction is carried out is not critical, and depends, to some degree, on the nature of the particular anhydrides being used and the particular amines being used. Best results are usually achieved when the reaction temperature is maintained below 100° C. Higher temperatures can cause the resulting polyamic acid to cyclize the corresponding imide.

After the reaction has been completed, the product is in the form of a polyamic acid which can be converted to the corresponding isoimide oligomer through the use of a cyclization or dehydrating agent. Those dehydrating agents which are highly effective for use in the present invention constitute a class which permits the process to be operated at a relatively low temperature, at least as low as ambient temperature, when compared to prior art dehydrating agents.

After producing the polyamic acid, the reaction mixture is cooled to the reduced temperature about at least as low as the ambient temperature. The reduced temperature preferably is a temperature within a range of 0° C. to about 75° C. and more preferably 0° C. to about 20° C. It is quite preferable to carry out the dehydration reaction at a relatively low temperature, such as ambient temperature or below, e.g., the preferred range of 0° C. to about 20° C.

In order to cyclize the polyamic acid, the dehydrating agent is added to this reaction mixture under proper conditions to cause cyclization of the polyamic acid. The preferred group of dehydrating agents used in accordance with the present invention are characterized by having the following properties:

(1) The dehydrating agent is readily soluble with a polyamic acid in a common solvent.

(2) The dehydrating agent is capable of cyclizing a polyamic acid at the aforesaid reduced temperatures.

(3) The dehydrating agent does not substantially adversely affect the solubility of any of the reactants in the presence of the polyamic acid, and even more so, permits all of the necessary reactants to remain in the solution.

(4) The dehydrating agent is of a nature such that under the conditions of the reaction with the polyamic acid, such agent does not cause generation of a substantial amount of undesirable side-reaction products which cannot be readily removed and which might or which do adversely affect the isoimide oligomer thus produced.

(5) The dehydrating agent does not adversely affect the polyimide produced from the reaction mixture.

The preferred dehydrating agent is trifluoroacetic anhydride, and particularly N,N'-disubstituted carbodiimide, such as N,N'-dicyclohexyl carbodiimide (DCC) dissolved in tetrahydrofuran, and ketene.

As noted above, another type of isoimide-containing oligomer usable herein, results when an aromatic polyamine is reacted with the dianhydride, preferably prior to reaction with the mono-amine. The polyamine, and preferably a diamine, serves to link together two or more moles of the dianhydride, leaving terminal anhydride groups capable of reaction with the monoamine. In general, use is made of at least one mole of the polyamine for each mole of the dianhydride and at least one mole of the mono-amine per mole of the dianhydride.

The diamine is preferably a compound having the formula:

$$H_2N-R_5-NH_2$$

wherein $R_5$ is a divalent aromatic group, preferably containing 6 to 30 carbon atoms. Preferred are arylene, arylene ether, and arylene thioether groups. Representative of such groups include a phenylene group or a naphthylene group as well as a group having the formula:

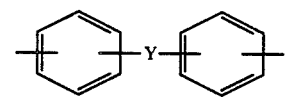

wherein Y is

$-(CH_2)_x-$ where x is an integer from 1 to 5, $-O-$, $-S-$, $-SO_2-$, $-(CF_2)_x-$, $-C(CF_3)_x-$ where x is as defined above, and the following groups:

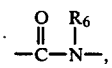

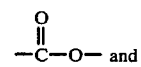

wherein $R_6$ and $R_{12}$ are aryl (such as phenyl and naphthyl and substituted derivatives thereof) or alkyl containing 1 to 5 carbon atoms, or heterocyclic, preferably containing 5 to 18 carbon atoms.

In addition, $R_5$ can also be a group of the formula:

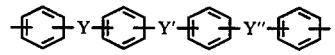

wherein Y, Y' and Y" are each the same or different and are selected from the same group as Y as defined above. As will be appreciated by those skilled in the art, the aryl groups set forth above as being part of the $R_5$ group can also be substituted with, for example, one or more halogen atoms, lower alkyl groups and/or lower alkoxy groups.

Such diamines are well known to those skilled in the art and are described in detail in U.S. Pat. Nos. 3,261,811 and 3,345,342. Typical of such amines are:
meta-phenylenediamine,
2,2-bis(4-aminophenyl)propane
4,4'-diaminodiphenyl methane,
4,4'-diaminodiphenyl sulfide,
4,4'-diaminodiphenyl sulfone,
3,3'-diaminodiphenyl sulfone, 2,6-diaminopyridine,
bis-(4-aminophenyl)diethylsilane,
bis-(3-aminophenyl)ethyl phosphine oxide,
1,3-di(3-aminophenoxy)benzene
2,2-di(3-aminophenyl)hexafluoropropane
2,2-di(4-aminophenyl)hexafluoropropane It is believed that the diamine reacts with the anhydride to form the corresponding polyamic acid having free acid anhydride groups available for reaction with the mono-amine. After the reaction between the dianhydride and the diamine has been completed, it is generally preferable to introduce the mono-amine for reaction with those free terminal acid anhydride groups to form an oligomer end-blocked with the mono-amine. That reaction product is then subjected to dehydration to convert the polyamic acid to the corresponding isoimide.

That overall reaction, again without limiting the present invention as to theory, may be illustrated diagrammatically as follows:

third type of oligomer, a dianhydride having the formula:

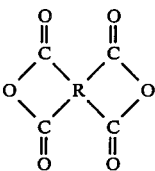

is reacted with a diamine having the formula:

$$H_2N-R_5-NH_2$$

to form an amine-terminated polyamic acid which is then reacted with an anhydride having the formula:

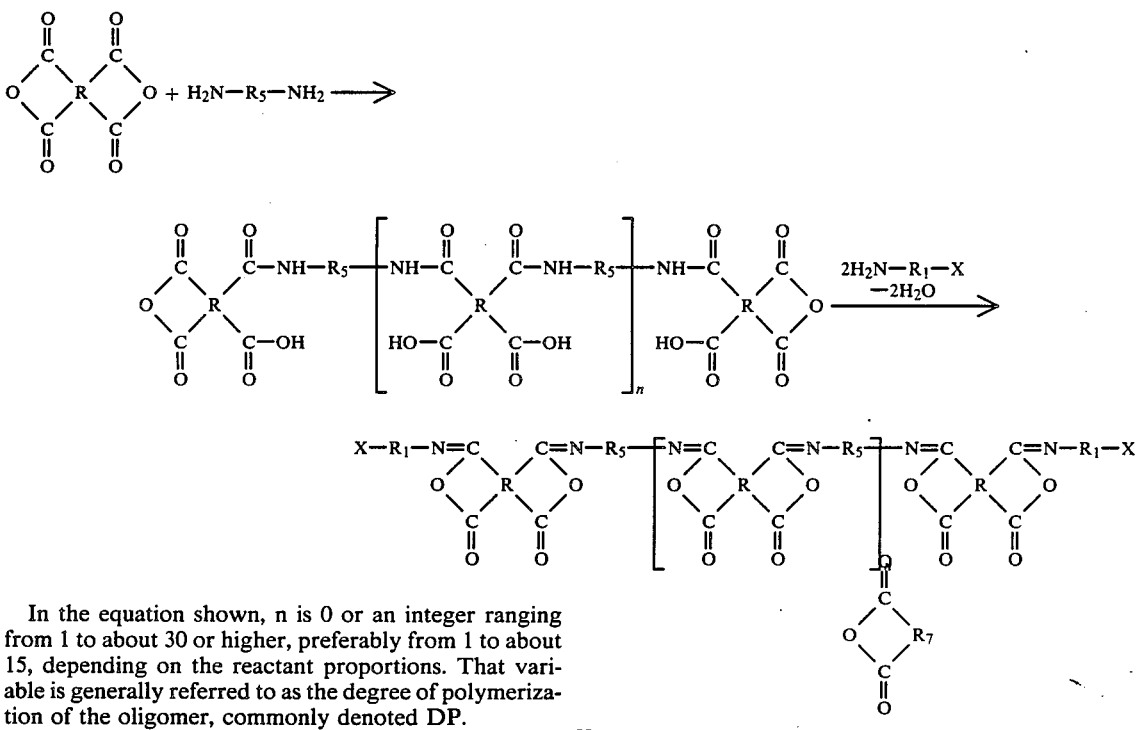

In the equation shown, n is 0 or an integer ranging from 1 to about 30 or higher, preferably from 1 to about 15, depending on the reactant proportions. That variable is generally referred to as the degree of polymerization of the oligomer, commonly denoted DP.

Preferred oligomers of this second type are prepared from a dianhydride such as 3,4-3'4'-benzophenonetetracarboxylic dianhydride, an amine-terminated aryl polyether, and an amino phenylacetylene mono-amine.

It is also possible in preparing the oligomer used herein to employ reactants in which the end-capping group containing a polymerizable functional group also contains an anhydride group. In accordance with this wherein R and $R_5$ are defined above and wherein $R_7$ is a heterocyclic group, or a radical containing an alkenylene group or a trivalent organic group, which is preferably an aryl group, having substituted thereon a functional group capable of undergoing addition polymerization reactions as described above.

The resulting product is then subjected to a dehydration reaction to convert at least some of the amic acid groups to isoimide groups. This procedure may be illustrated by the following equation:

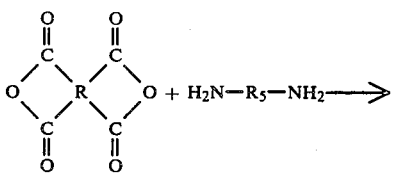

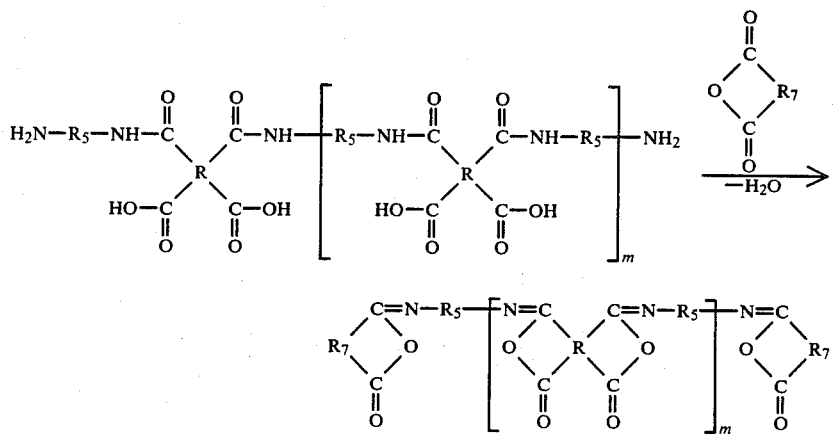

In the foregoing equation, m denotes the degree of polymerization, which can range from 1 to about 30 and preferably 1 to about 15. As with the preceding equations, the products shown above are illustrated in an idealized form, with all of the sites where either imide or isoimide groups could be formed taking the form of an isoimide group. In actual fact, again, some of those groups are in the imide form.

As the functional anhydride, use can be made of a variety of mono-anhydrides, such as the following:
4-ethynyl-phthalic anhydride
3-ethynyl-phthalic anhydride
4-vinyl-phthalic anhydride
4-cyano-phthalic anhydride
Maleic anhydride
bicyclo[2,2,1]hept-2-ene-5,6-dicarboxylic anhydride Before the above-described oligomers of the referenced Landis patent applications are cured, these materials exhibit good solubility and tractability. However, when these oligomers are cured, chemical reactions occur which render those materials insoluble and intractable. In accordance with the present invention, at some stage during the total curing process, these materials exist in a "partially cured" state in which the material is not fully cured and still possesses sufficient solubility and tractability to be capable of having another material adhere to it. Then, when the "partially cured" material is fully cured, the adhering material, such as a solar cell, becomes bonded to the cured material. The determination of the appropriate "partially cured" condition of the oligomer may be readily made by routine experimentation.

In the preparation of the substrate of the present invention, as disclosed above, the polyimide precursor oligomer containing isoimide groups is imidized with the fiber reinforcement, such as graphite or Kevlar ® fiber or fabric, dispersed within the oligomer or a solution thereof. This imidization can be accomplished with the reinforcement fibers in place because the isoimide groups increase the solubility of the polyimide to the extent that it can be solution cast into thin films with fibers in place. Thus, a solution of oligomer and/or polyimide in a suitable solvent such as a reaction or lacquer solvent can be used to impregnate a reinforcing fabric, or a reinforcing fabric can be placed within a receptacle containing a thin layer of the oligomer and/or polyimide solution, after which, where needed, sufficient curing is effected to yield a self-supporting prepreg structure. Simple heat treatment, say at temperatures of about 200° C. to 300° C., under a pressure of about 50 psi to 200 psi can be used to complete curing and convert the reinforced film into a trough insoluble, cross-linked radiation resistant film. Thus, the steps of using an adhesive for bonding reinforcement fiber to the substrate and for bonding solar cells to the substrate are eliminated by the present invention.

The substrate film of this invention can vary in thickness from about 0.001 in. to 0.005 in., preferably about 0.002 in. to 0.005 in. depending on mission requirements. Thus, the reinforced substrate is relatively thin and also is flexible.

More specifically, the substrate can be manufactured by applying the oligomer containing isoimide groups to fiber cloth or the like to create a prepreg, which is then imidized, as previously described. Prior to completion of the cure, the substrate can be mounted onto a suitable frame and then standard solar cells, along with associated circuitry, can be directly placed on the substrate. Cure is completed, and the solar cells become bound or bonded to the substrate film. Of course, if desired, it would be possible to complete the cure of the substrate and then adhesively bond solar cells thereto as used in conventional procedures. The solar cells can be coated with the aforementioned transparent cover polyimide or other equivalent material such as:

LARC-II Polyimides:

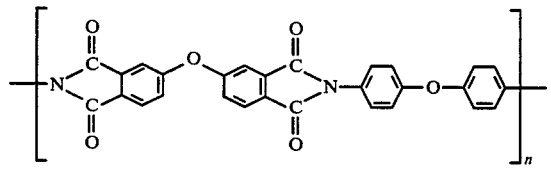

Phenylated polyphenylene oxide:

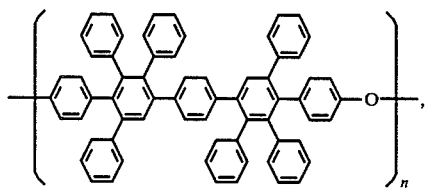

either prior to or after bonding of the cells to the substrate.

A typical solar cell for use in the present invention may comprise, for example, a base of a p-type semiconductor material, such as silicon, gallium arsenide, gallium arsenide phosphide, including a p-layer and an adjacent n-layer to provide a p-n junction. A p-layer electrode is attached to the bottom side of the p-layer for an electrical conductor to be connected thereto; and an n-layer electrode is attached to the n-layer to enable an electrical conductor to be connected thereto. An anti-reflective coating may be deposited on the active surface of the cell (i.e. the upper surface of the n-layer). A primer coating may be deposited on the anti-reflective coating or directly on the upper surface of the n-layer. In accordance with the present invention using such a solar cell, the solar cell is positioned on the partially cured polyimide substrate with the p-layer electrode adjacent the substrate so that the active surface of the solar cell is capable of receiving incoming radiation on the front surfaces of the cell.

The following examples are presented to illustrate certain aspects of the present invention, and are not intended to limit the scope of the invention.

EXAMPLE 1

Three batches of oligomer containing isoimide groups were prepared, each having a different degree of polymerization. Solubility and melting point determinations are summarized in the following Table 1:

TABLE 1
PROPERTIES OF HR605P, HR610P, AND HR615P OLIGOMERS

| RESIN | DP | SOLUBILITY* | MELTING RANGE, °F. START | FULL MELT |
|---|---|---|---|---|
| HR605P | 5 | THF, Yes | 396 | 415 |
| HR610P | 10 | DMF, Yes | 404 | 438 |
| HR615 | 15 | NMP, Yes MEK, No | 406 | 426 |

*THF = tetrahydrofuran
DMF = N,N—dimethyl formamide
NMP = N—methyl pyrrolidinone
MEK = methyl ethyl ketone
The solubility data is for all three of the oligomers The above oligomers have the repeating unit of Formula B previously described herein, with DP as in TABLE 1.

To illustrate the use of the above three resins, several experimental unreinforced and reinforced films were made. TABLE 2, set forth herein below, summarizes the impregnation and cure procedures utilized to prepare the polyimide film reinforced with graphite and Kevlar ® papers.

TABLE 2
EXPERIMENTAL FILMS

| SAMPLE CODE | RESIN SOLUTION | SUBSTRATE | COATING METHOD | CURE | RESULTS |
|---|---|---|---|---|---|
| A1 | HR605P/THF, 50% solids | Glass plate coated with 87X-76 mold release | 0.0015" doctor blade | 15 min. at RT; melt at 415° F.; 15 min. at 500° F. | Foamy film |
| A2 | HR605P/NMP, 50% solids | Glass plate coated with 87X-76 and MS122 mold releases | 0.0015" doctor blade | 15 min. at 500° F. | Brittle film, much shrinkage |
| A3 | HR605P/THF, 20% solids | 181 glass cloth | spray gun, 40 psi | 15 min. at 500° F.; apply 2nd coat; 15 min. at 500° F. | Fabric was impregnated, but a continuous film was not formed |
| A4-1 | HR605P/NMP, 30% solids | Graphite paper, 0.0022" | Pull through metering bars, 0.004" gap | Cure cycle No. 1: 30 min. at 500° F. | Resin content, 80% thickness, 0.0042"; fibers coated; film not formed; very porous. |
| | | | | Cure cycle No. 2: Start at 150° F. heat to 500° F. at 6° F./min.; 30 min. at 500° F. | Cycle No. 2: same as above |
| A4-2 | HR605P/NMP, 30% solids | Thornel-300 graphite fabric, 0.0072" | Pull through metering bars, 0.009" gap | Cure cycle No. 1: 30 min. at 500° F. | Resin content, 23%; thickness, 0.012"; Fibers coated; film not formed; very porous. |
| | | | | Cure cycle No. 2: Start at 150° F.; heat to 500° F. at 6° F./min.; 30 min. at 500°F. | Same as above |
| A5 | HR605P/NMP, 50% solids, plus 1% DC200 wetting agent | Glass plate coated with 87X-76 mold release | 0.002" doctor blade | — | Would not form a film; watery |
| A6 | HR605/NMP, 50% solids | Glass plate coated with 87X-76 mold release | 0.0015" doctor blade | Heat at 500° F. at 6° F./min.; 30 min. at 500° F. | Good film |
| A6-1 | HR605P/NMP, 50% solids | Start with A6 film on glass plate (above) | Apply another film layer using 0.002" doctor blade. Laminate on one ply of graphite paper and one ply of graphite fabric. Apply pressure; cure as for A6 above. | | Good film with dry fabric on one side. |
| B2 | HR610P/NMP, 50% solids | Glass plate coated with 87X-76 mold | 0.0015" doctor blade | Heat to 500° F. at 6° F./min.; 2 hrs. | Film formed; 0.001" thick; some |

TABLE 2-continued
EXPERIMENTAL FILMS

| SAMPLE CODE | RESIN SOLUTION | SUBSTRATE | COATING METHOD | CURE | RESULTS |
|---|---|---|---|---|---|
| | | release | | at 500° F. | shrinkage and fish-eyes |
| C1 | HR615P/NMP, 50% solids | Glass plate coated with 87X-76 mold release | 0.0015" doctor blade | Heat to 500° F. at 6° F./min.; 2 hrs. at 500° F. | Film formed; 0.001" thick; some shrinkage and fish-eyes |
| B3 | HR610P/NMP, 50% solids | Glass plate coated with 87X-76 mold release | 0.0015" doctor blade | Heat to 500° F. at 6° F./min.; 1 hr. at 500° F. | Good film, 3 fish-eyes |
| B3-1 | HR610P/NMP, 50% solids | Start with B3 film on glass plate | Spray coat one ply each of graphite paper and fabric (40 psi spray). Laminate, apply pressure; cure as for B2 | | Good film with dry fabric on one side |
| B4 | HR610P/NMP, 50% solids | Glass plate coated with 87X-76 mold release. Start with B3 film on glass plate, except use A110 silane solution on glass plate | Spray coat one ply each of graphite paper and fabric (40 psi spray). Laminate, apply pressure; cure as for B2. | | Good film with dry fabric on one side |

As seen from the above TABLE 2, routine experimentation with respect to substrate, coating method, curing condition and particular resin solution selected, enable the skilled artisan to prepare an acceptable substrate material.

In accordance with one embodiment of the present invention, a solar cell array panel may be formed as follows. Using the conditions set forth in Table 2 for Sample Code A6/A6-1, for example, a thin cured film of the substrate polyimide containing isoimide groups is provided, an additional layer of oligomer solution is applied to the cured film, reinforcing fiber is laid over the newly-applied oligomer solution, and the latter is partially cured. In the preferred method of the present invention, prior to completion of a cure as set forth in TABLE 2, the solar cells are placed directly on the substrate laminate with the active or front surface of the cell exposed. Then, curing of the polyimide is completed, as previously described. After completion of the cure, at least the front surfaces of the solar cells are spray coated with the transparent protective polyimide, with the use of an intermediate primer layer where desired. In such a structure, the solar cells are securely attached or bonded to the substrate and this bond is capable of withstanding exposure to a space environment without degradation.

In an alternate embodiment of the invention, a solar cell array comprising interconnected solar cells is inverted and then used as a support on which the solar panel substrate of reinforced polyimide is formed. The front surfaces of the solar cells are coated with the protective transparent polyimide before inversion of the array or after formation of the solar panel substrate on the inverted array.

Variations of the invention will be apparent to the skilled artisan.

What is claimed is:

1. An integral solar cell panel comprising a plurality of interconnected solar cells attached to a fiber-reinforced polyimide film substrate, wherein said solar cells are bonded to the surface of said polyimide film by the final curing of said polyimide.

2. The solar panel of claim 1 which further includes a transparent protective polymer coating on the front surface of said solar cells.

3. The solar panel of claim 1 or claim 2 wherein said polyimide is cured from oligomers containing isoimide groups.

4. The solar panel of claim 3 wherein said polyimide is cured from oligomers selected from at least one member of the group consisting of

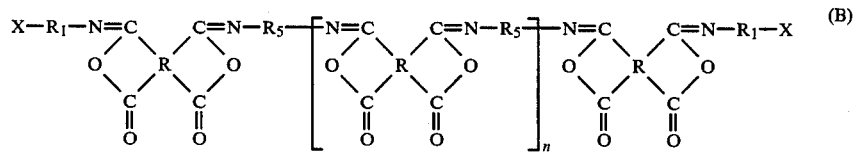

and

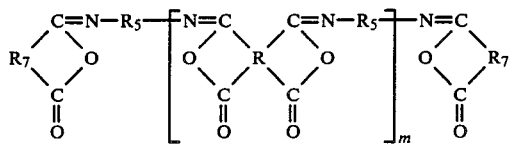
(C)

where up to 70% of the (iso)imide groups present can be in the form of imide groups and where R is a tetravalent organic group containing 2 to 27 carbon atoms, $R_1$ is a divalent organic group containing 1 to 20 carbon atoms, $R_5$ is a divalent aromatic group containing from 6 to 30 carbon atoms, $R_7$ is a trivalent aryl group having substituted thereon X, or a heterocyclic group, or a radical containing an alkenylene group, X is a functional group capable of undergoing addition polymerization, n denotes the degree of polymerization and is 0 or 1 to about 30, and m denotes the degree of polymerization and is 1 to about 30.

5. The solar panel of claim 4 wherein the polyimide is of the formula (B).

6. The solar panel of claim 2 wherein the transparent protective coating is a polyimide having the recurring structural unit

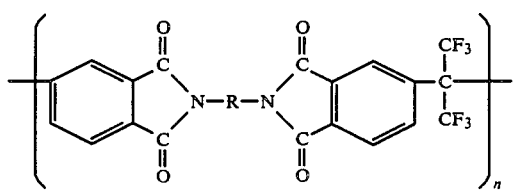
I

7. The solar panel of claim 2 wherein said polyimide is cured from oligomers containing isoimide groups and the transparent protective coating is a polyimide having the recurring structural unit

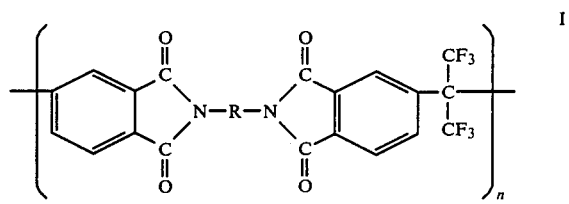
I where R is:

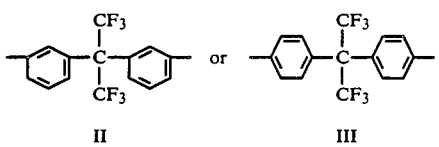
II    III and n has a value range from 10 to about 2000.

8. The solar panel of claim 2 wherein said polyimide is cured from oligomers selected from at least one member of the group consisting of

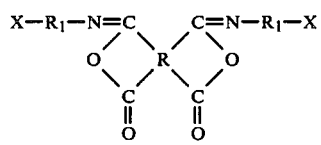
(A)

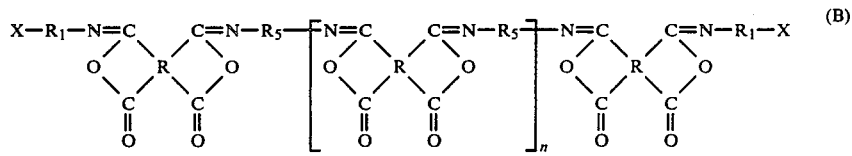
(B)

and

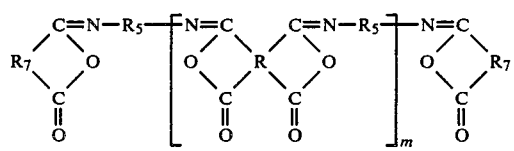
(C)

where R is:

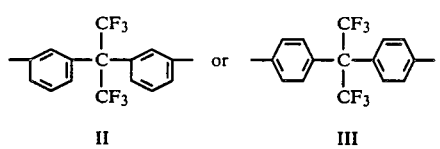
II    III and n has a value range from 10 to about 2000.

where up to 70% of the (iso)imide groups present can be in the form of imide groups and where R is a tetravalent organic group containing 2 to 27 carbon atoms, $R_1$ is a divalent organic group containing 1 to 20 carbon atoms, $R_5$ is a divalent aromatic group containing from 6 to 30 carbon atoms, $R_7$ is a trivalent aryl group having substituted thereon X, or a heterocyclic group, or a radical containing an alkenylene group, X is a functional group capable of undergoing addition polymerization, n denotes the degree of polymerization and is 0 or 1 to about 30, and m denotes the degree of polymerization and is 1 to about 30 and the transparent protective coating is a polyimide having the recurring structural unit and n has a value range from 10 to about 2000.

9. The solar panel of claim 6 wherein said recurring structural unit is

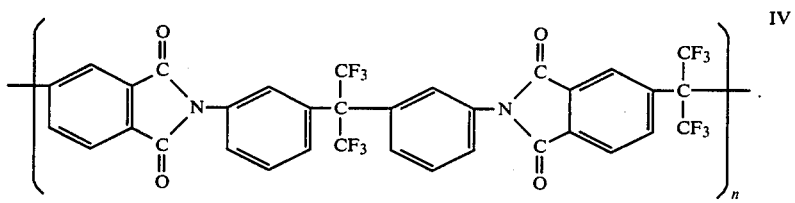

10. The solar panel of claim 7 wherein said recurring structural unit is

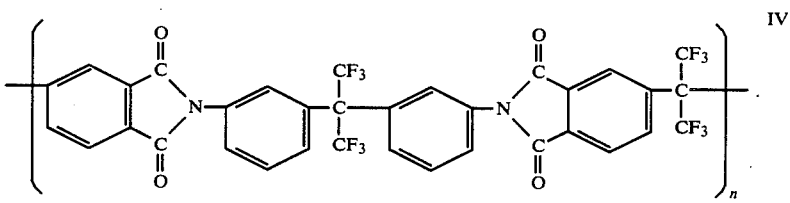

11. The solar panel of claim 8 wherein said recurring structural unit is

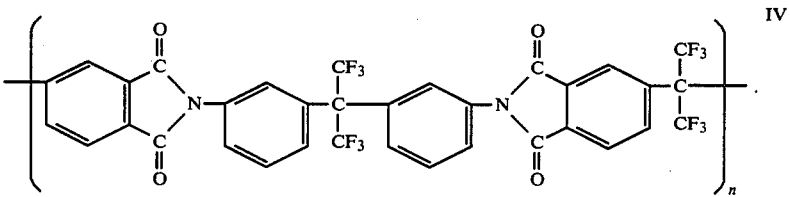

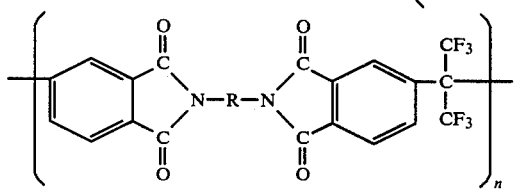

where R is:

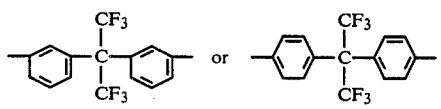

12. The solar panel of claim 1 wherein said fibers are graphite.

13. The solar panel of claim 12 wherein said fibers are also bonded to the surface of the polyimide film by the final curing of said polyimide.

14. A method for manufacturing an integral solar cell panel comprising forming a partially cured, fiber-reinforced substrate film from a solution containing at least one of the following oligomers:

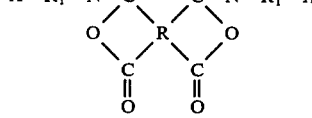

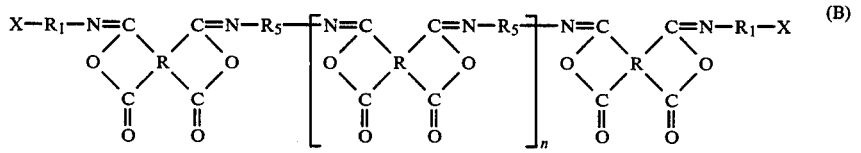

and

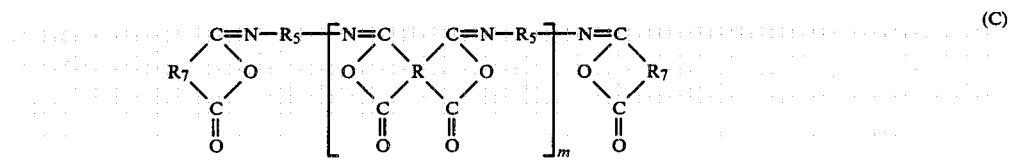

where up to 70% of the (iso)imide groups can be in the form of imide groups and where R is a tetravalent organic group containing 2 to 27 carbon atoms, $R_1$ is a divalent organic group containing 1 to 20 carbon atoms, $R_5$ is a divalent aromatic group containing from 6 to 30 carbon atoms, $R_7$ is a trivalent aryl group having substituted thereon X, or a heterocyclic group, or a radical containing an alkenylene group, X is a functional group capable of undergoing addition polymerization, n denotes the degree of polymerization and is 0 or 1 to about 30, and m denotes the degree of polymerization and is 1 to about 30, placing a plurality of solar cells on a surface of said substrate film while in a partially cured state and completing the cure of said substrate film to thereby bond said solar cells to said substrate film.

15. The method of claim 14 wherein an array of interconnected solar cells is formed and the array is placed on the surface of the partially cured substrate film.

16. The method of claim 14 wherein the front surfaces of the solar cells are coated with a transparent protective polymer.

17. The method of claim 16 wherein the protective polymer is a transparent polyimide having the recurring structural unit

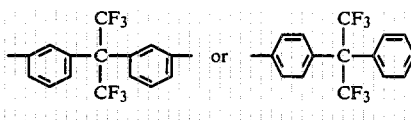

where R is:

and n has a value range from 10 to about 2000.

18. The method of claim 17 wherein the transparent polyimide has the recurring structural unit

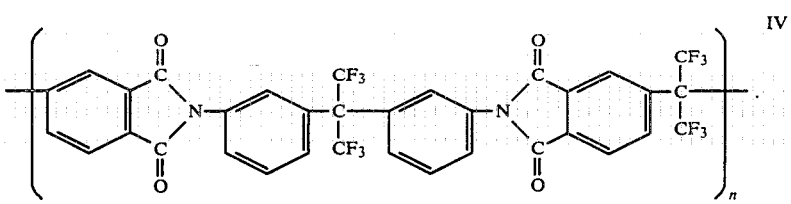

19. The method of claim 16 wherein the solar cells are coated with the transparent polymer prior to being placed on the partially cured substrate film.

20. The method of claim 17 wherein the solar cells are coated with the transparent polyimide prior to being placed on the partially cured substrate film.

21. The method of claim 18 wherein the solar cells are coated with the transparent polyimide prior to being placed on the partially cured substrate film.

22. The method of claim 16 wherein the solar cells are coated with the transparent polymer after the completion of the cure of the substrate film.

23. The method of claim 17 wherein the solar cells are coated with the transparent polyimide after the completion of the cure of the substrate film.

24. The method of claim 18 wherein the solar cells are coated with the transparent polyimide after the completion of the cure of the substrate film.

25. A solar cell panel formed by the process of claim 14.

* * * * *